United States Patent [19]

Chan et al.

[11] Patent Number: 5,116,777
[45] Date of Patent: May 26, 1992

[54] METHOD FOR FABRICATING SEMICONDUCTOR DEVICES BY USE OF AN N+ BURIED LAYER FOR COMPLETE ISOLATION

[75] Inventors: Tsiu C. Chan, Carrollton; Mehdi Zamanian, Dallas, both of Tex.

[73] Assignee: SGS-Thomson Microelectronics, Inc., Carrollton, Tex.

[21] Appl. No.: 516,287

[22] Filed: Apr. 30, 1990

[51] Int. Cl.$^5$ ............................................. H01L 21/76
[52] U.S. Cl. ........................................ 437/56; 437/33; 437/59; 437/77
[58] Field of Search ................. 437/26, 56, 57, 31, 437/34, 33, 63, 27, 54, 59, 74–77; 357/44, 43, 36; 148/DIG. 9, DIG. 85, DIG. 87

[56] References Cited

U.S. PATENT DOCUMENTS

| | | | |
|---|---|---|---|
| 3,802,968 | 4/1974 | Ghosh et al. | 437/77 |
| 4,016,596 | 4/1977 | Magdo et al. | 437/63 |
| 4,403,395 | 9/1983 | Curran | 437/31 |
| 4,825,274 | 4/1989 | Higuchi et al. | 357/43 |
| 4,855,244 | 8/1989 | Hutter et al. | 437/34 |
| 4,868,626 | 9/1989 | Nakazato et al. | 357/44 |
| 4,887,142 | 12/1989 | Bertotti et al. | 357/44 |
| 4,892,836 | 1/1990 | Andreini et al. | 437/56 |
| 4,903,093 | 2/1990 | Ide et al. | 357/43 |
| 4,912,054 | 3/1990 | Tomassetti | 437/56 |

Primary Examiner—Brian E. Hearn
Assistant Examiner—C. Chaudhari
Attorney, Agent, or Firm—Richard K. Robinson; Kenneth C. Hill; Richard A. Bachand

[57] ABSTRACT

An N+ buried layer is formed under all the N-channel devices in the memory array of an integrated circuit device. The N+ buried layer can also be formed under N-channel input/output devices. The N+ buried layers include contacts to the power supply. Such a device layout provides for complete isolation of the memory array from the remainder of the circuitry. The isolation of the N-channel input/output devices also provides for enhanced immunity to input/output noise.

15 Claims, 4 Drawing Sheets

METHOD FOR FABRICATING SEMICONDUCTOR DEVICES BY USE OF AN N+ BURIED LAYER FOR COMPLETE ISOLATION

BACKGROUND OF THE INVENTION

1. Field of the Invention

The present invention relates generally to the manufacture of semiconductor integrated circuit devices, and more specifically to a method for providing improved isolation and noise immunity for field effect devices.

2. Description of the Prior Art

Bipolar and CMOS technologies are increasingly being combined in a single integrated circuit device. Such a combination can provide the benefits of low power CMOS circuitry on most of the chip, with the high input/output driving capacity of bipolar devices. Such combined devices can result in a small, high speed, low power integrated circuit.

In dynamic random access memories (DRAM), the memory array is fabricated from N-channel field effect devices. Static random access memories (SRAM) use N-channel devices with polycrystalline silicon load devices in the memory array. Both types of memories often use CMOS in the periphery of the device for providing decode functions, sense amplifiers and so forth. Bipolar transistors are generally used only for input/output interfaces.

Generally, the memory cell and peripheral N-channel transistors are formed in a P-well with a P+ buried layer underneath. Bipolar NPN transistors are built in an N-well with an N+ buried layer for a collector. Such transistors require the use of a P-type substrate. P-channel transistors are formed in an N-well with an N+ buried layer for improved resistance.

For high density memory devices, various types of low level noise cause significant problems with device operation. This noise can be caused by alpha particle events and switching noise from the peripheral circuitry. Also, a great deal of noise can be generated by the input/output circuitry.

In addition, latch-up has always been a major concern in CMOS devices. This is especially true in the peripheral circuitry.

It would be desirable for a semiconductor device fabrication technique to provide improved noise immunity and increased protection from latch-up.

SUMMARY OF THE INVENTION

It is therefore an object of the present invention to provide a method for fabricating integrated circuits which provides improved latch-up protection.

It is another object of the present invention to provide such a method which provides greater noise immunity in a memory array of the device.

It is a further object of the present invention to provide such a method which provides greater noise immunity to input/output noise.

Therefore, according to the present invention, an N+ buried layer is formed under all the N-channel devices in the memory array of an integrated circuit device. The N+ buried layer can also be formed under N-channel input/output devices. The N+ buried layers include contacts to the power supply. Such a device layout provides for complete isolation of the memory array from the remainder of the circuitry. The isolation of the N-channel input/output devices also provides for enhanced immunity to input/output noise.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

FIG. 1–4 are each drawn in two parts. Processing activities take place simultaneously in both subparts of each figure. Thus, for example, a processing step which takes place in FIG. 1A takes place simultaneously in FIG. 1B.

The preferred method begins with a substrate 10 formed from a P-type silicon crystal having a <100> orientation. N+ buried layers 12–18 are implanted using a mask. Arsenic or antimony are preferably used as the implant dopant, due to their relatively lower mobility during later high temperature processing steps. The N+ regions 12–18 are preferably implanted at a dosage of approximately $3 \times 10^{15}/cm^2$.

A P+ buried layer is then implanted in the substrate 10 without a mask. This implant is made at a lower dosage than used for the N+ implant, so that the N+ buried layers 12–18 are unaffected, while the remaining regions 20–30 become P+ buried layers. The P+ regions 20–30 are preferably formed using boron implanted at a dosage of approximately $3 \times 10^{13}/cm^2$. This doping level is about 1% of that used for the N+ regions, so that, as described above, the N+ buried regions 12–18 are unaffected by this implant. A relatively lighter implant for the P+ buried layer regions 20–30 is also preferred due to the mobility of the boron used for the implant.

After all of the buried layers have been formed, an epitaxial layer 32 is grown over the surface of the device. This epitaxial layer 32 may be formed from intrinsic silicon, or may be a lightly doped N− or P− epitaxial layer. It is not necessary for the epitaxial layer 32 to be doped N-type or P-type, since the N-well and P-well will both be formed by implant.

Figure 1A:
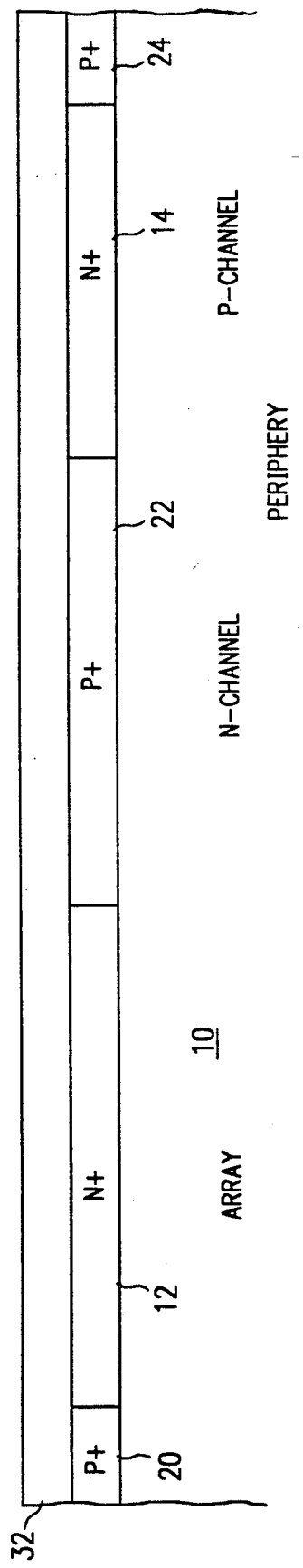
FIGS. 1–4 illustrate a method for forming an integrated circuit device according to the present invention.
Figure 1B:
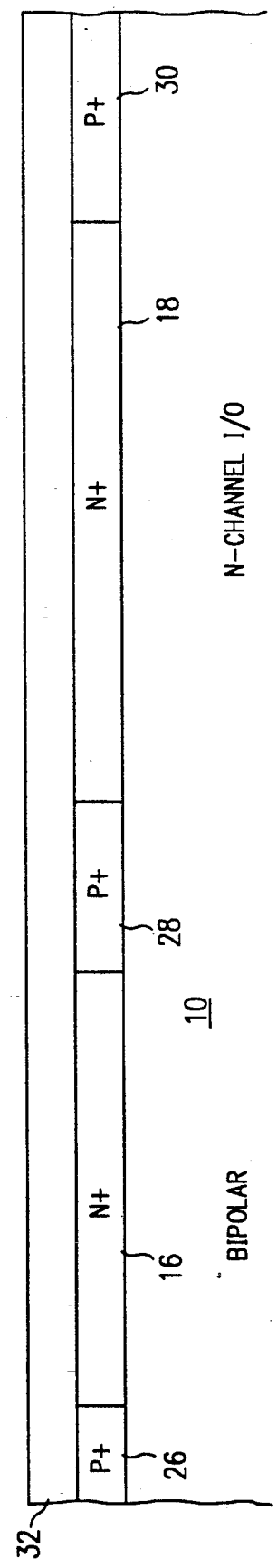
Figure 2A:
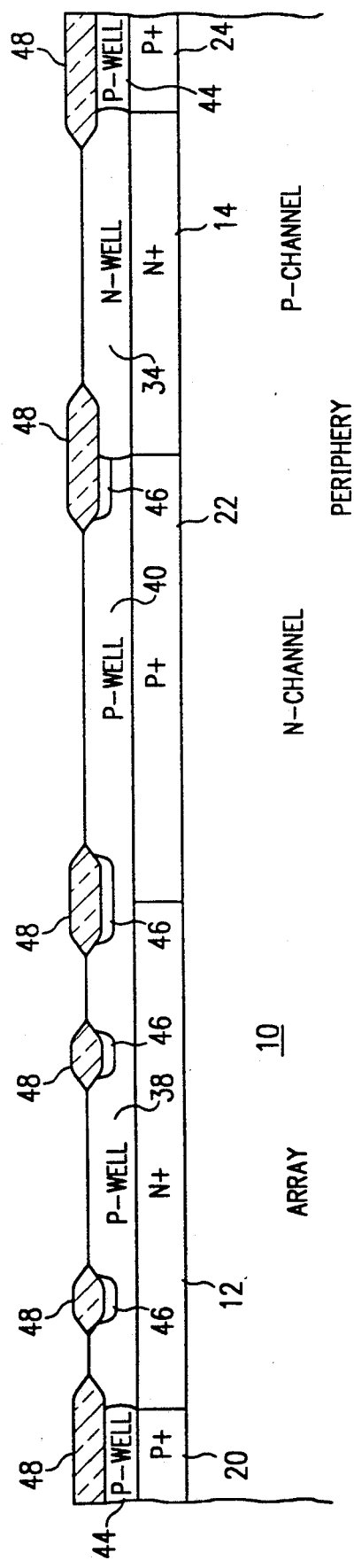
Figure 2B:
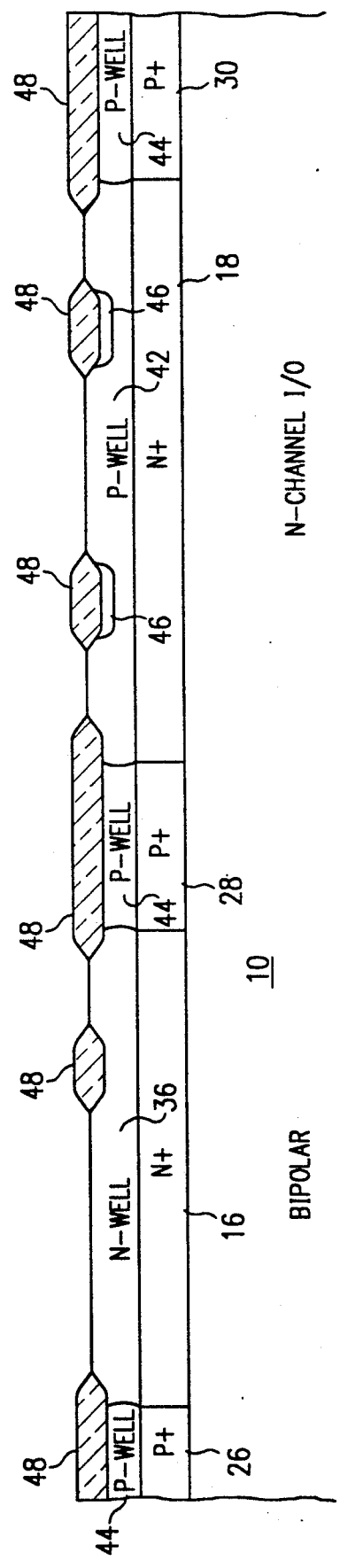

Referring to FIG. 2, twin tubs are formed as in a conventional CMOS process. An N-well 34 is formed above N+ buried layer 14. P-channel devices in the periphery will be formed in N-well region 34. A similar N-well above an N+ buried layer is also used for any P-channel devices which are to be formed as part of the input/output circuitry (not shown).

N-Well 36 is formed over N+ buried layer 16 to define a region in which a bipolar NPN transistor is to be fabricated.

The remaining portions of the epitaxial layer 32 are implanted to form P-wells. P-well regions 38, 40, and 42 define regions in which active devices will be formed. N-channel field effect devices will be formed in these P-wells. P-well regions 44 provide isolation between various transistors on the device, and will be covered by field oxide.

A pattern is used to define the active areas, and is used to define a conventional isolation implant. This isolation implant results in P+ regions 46. An oxidation step then causes the formation of field oxide regions 48, and drives the implanted buried layers and isolation regions 46 to the positions shown in FIG. 2.

Figure 3A:
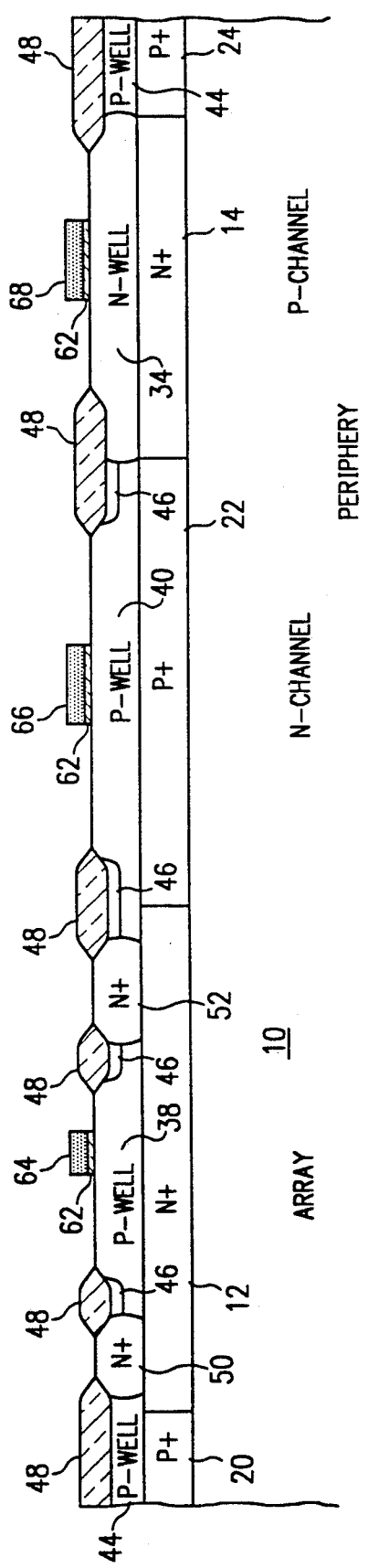
Figure 3B:
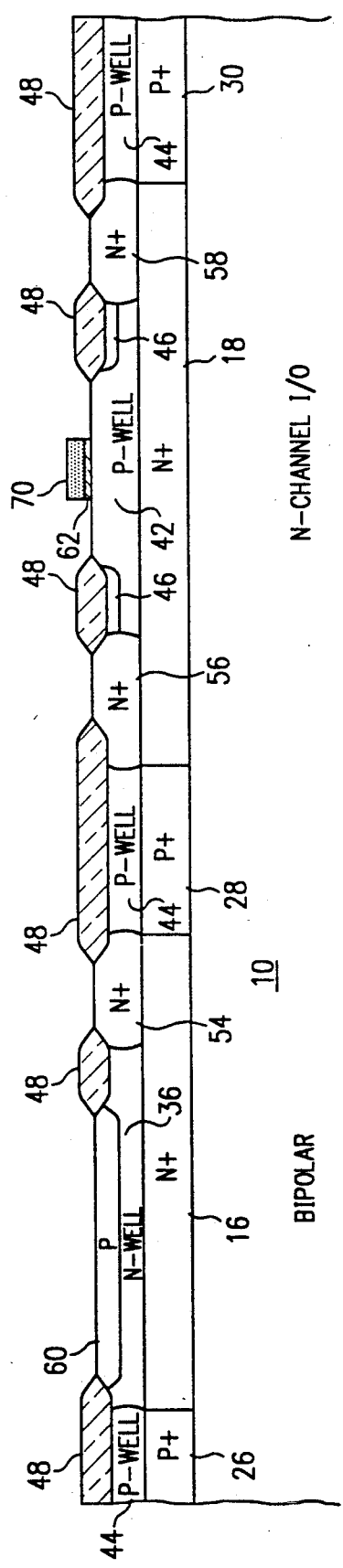

Referring to FIG. 3, an N+ implant is made through a mask to define N+ collector regions 50-58. Regions 50, 52, 56, and 58 provide connections to the N+ buried layers 12 and 18 for connection to $V_{cc}$. N+ region 54 makes contact to buried collector region 16 as part of the bipolar NPN transistor.

Another mask is used to implant a P-type base region 60 for the bipolar transistor. Further masks are used to make threshold voltage adjust implants for the N-channel and P-channel transistors as known in the art.

A gate oxide layer and polycrystalline silicon layer are formed over the surface of the device, and patterned to form gate oxide regions 62 and polycrystalline silicon gates 64-70. The gates may be silicided if desired for improved conductivity as known in the art.

Figure 4A:
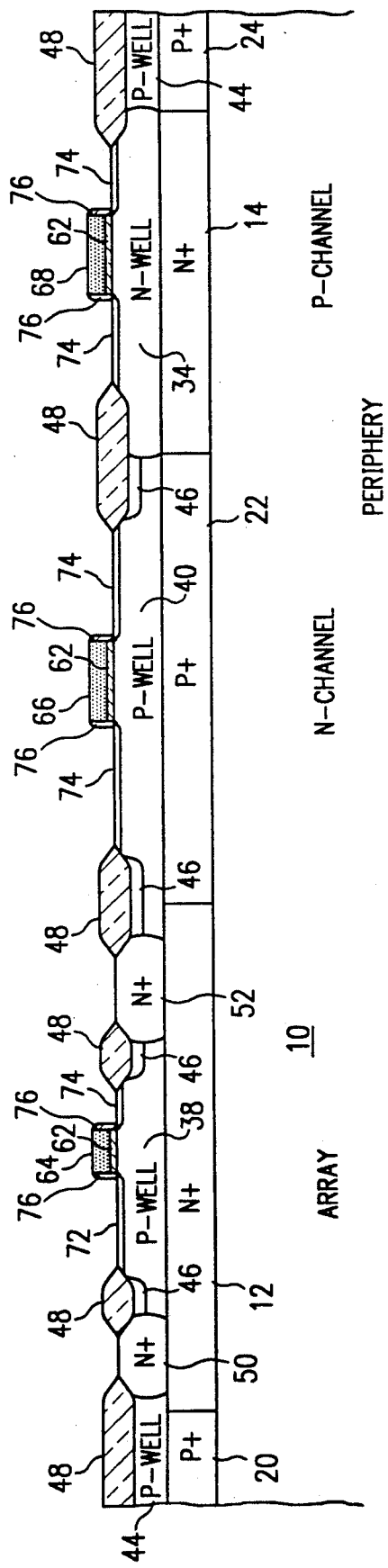
Figure 4B:
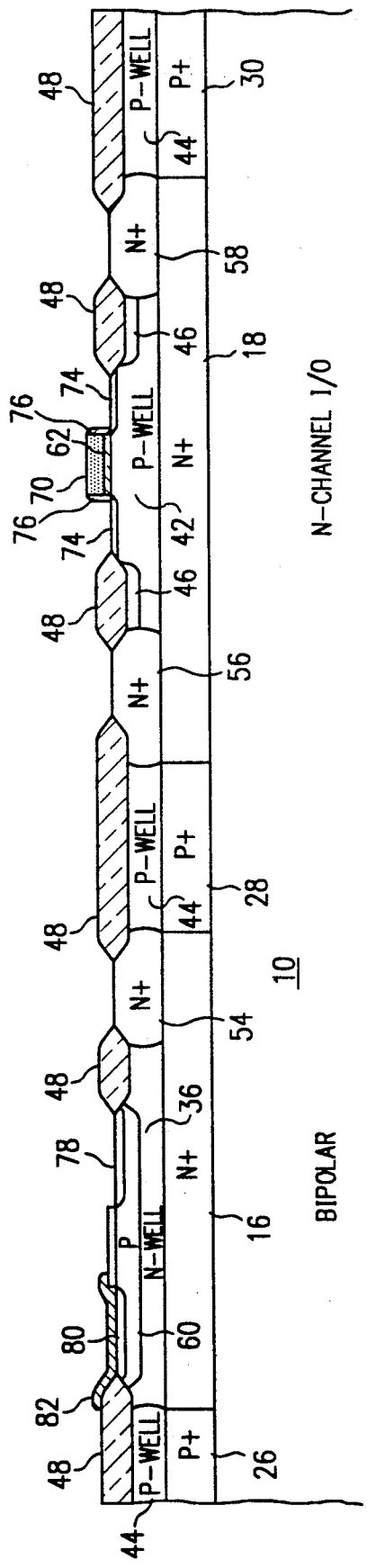

Referring to FIG. 4, masks are used to define source/drain regions for the field effect devices and a base contact region for the bipolar device. Source/drain region 72 is used for contact with an overlying DRAM storage capacitor (not shown). Source/drain regions 74 are normal source/drain regions as known in the art. All field effect devices are preferably formed using lightly doped drain (LDD) regions with sidewall oxide regions 76 used for masks as known in the art.

Base contact region 78 is formed during formation of the source/drain regions for the P-channel devices as known in the art. The emitter so for the bipolar transistor, and emitter contact 82, are formed as known in the art. The bipolar device may be a traditional diffused emitter device, or it may be a polycrystalline silicon emitter device.

Further processing from the stage shown in FIG. 4 continues according to conventional process flows. Interlevel dielectrics are formed, followed by one or more additional polycrystalline silicon layers. Finally, metallization and passivation are performed.

Devices formed according to the method herein described provide an N+ buried layer under all N-channel devices in the memory array. In the drawings, only a single N-channel device has been shown, but it will be understood that many such devices are actually included in the array. If the device being fabricated is a DRAM, the array will consist entirely of N-channel devices. If an SRAM device is being formed, the N+ buried layer will be continuous under the N-channel devices.

For both types of memory arrays, it is not necessary to make the collector contact regions 50, 52 for every transistor. The contacts can be spaced apart so as to minimize the layout area penalty required for them. For example, the collector regions 50, 52 can be spaced every 8, 16 or 32 transistors. In addition, it is preferable for a ring of N+ collector regions 50, 52 to be formed around the entire memory array for either SRAM or DRAM devices. This provides complete isolation for the memory array.

While the invention has been particularly shown and described with reference to a preferred embodiment, it will be understood by those skilled in the art that various changes in form and detail may be made therein without departing from the spirit and scope of the invention.

What is claimed is:

1. A method for fabricating a semiconductor memory device, comprising the steps of:
   forming an N-type buried layer in a substrate;
   forming an epitaxial silicon layer above said buried layer;
   forming a plurality of P-type regions in said epitaxial layer;
   forming a plurality of contacts to said N-type buried layer through said epitaxial layer wherein the plurality of contacts are spaced at regular intervals throughout the memory array; and
   forming an array of N-channel field effect devices in said P-type regions.

2. The method of claim 1, wherein the contacts comprise N-type diffusions through the epitaxial layer.

3. The method of claim 1, wherein at least one additional contact to the N-type buried layer forms a continuous structure around a memory array.

4. The method of claim 1, further comprising the steps of:
   forming N-type buried layers in locations wherein input/output N-channel devices are to be formed;
   forming input/output P-type regions over such N-type buried layers;
   forming contacts to the input/output buried layers through the input/output P-type regions; and
   forming N-channel input/output devices in the input/output P-type regions.

5. A method for fabricating semiconductor integrated devices, comprising the steps of:
   forming an N-type buried layer and a P-type buried layer in a substrate;
   forming an epitaxial silicon layer above said buried layers;
   forming a plurality of P-type regions in said epitaxial layer at least one over said N-type buried layer;
   forming at least one contact to said N-type buried layer through said epitaxial layer; and
   forming at least one N-channel field effect device in said at least one P-type region over said N-type buried layer.

6. The method of claim 5, wherein the at least one contact comprises N-type diffusions through the epitaxial layer.

7. The method of claim 5, further comprising the step of:
   forming N-type buried collector layers under the epitaxial layer in which NPN transistors are to be formed.

8. The method of claim 7, further comprising the step of:
   when the at least one contact is formed to the N-type buried layer, also forming N-type diffusions to contact the buried collector layers.

9. The method of claim 5, wherein the at least one contact to the N-type buried layer forms a continuous structure around a memory array.

10. The method of claim 5, further comprising the steps of:
   forming N-type buried layers in locations wherein input/output N-channel devices are to be formed;
   forming input/output P-type regions over such N-type buried layers;
   forming contacts to the input/output buried layers through the input/output P-type regions; and
   forming N-channel input/output devices in the input-/output P-type regions.

11. A method for fabricating semiconductor integrated devices, comprising the steps of:
   forming an N-type buried layer in a substrate;
   forming an epitaxial silicon layer above said buried layer;
   forming a plurality of P-type regions in said epitaxial layer;
   forming a contact to said buried layer through said epitaxial layer, said contact forming a continuous structure around a memory array, and
   forming a plurality of N-channel field effect devices in said P-type regions.

12. The method of claim 11, further comprising the steps of:
   forming N-type buried layers in locations wherein input/output N-channel devices are to be formed;
   forming input/output P-type regions over said N-type buried layers;
   forming contacts to the input/output buried layers through the input/output P-type regions; and
   forming N-channel input/output devices in the input-/output P-type regions.

13. The method of claim 11 wherein the contacts comprise N-type diffusions through said epitaxial layer.

14. The method of claim 11, further comprising the step of:
   forming N-type buried collector layers under the epitaxial layer in which NPN transistors are to be formed.

15. The method of claim 14, further comprising the step of: when the plurality of contacts are formed to said buried collector layers, also forming N-type diffusions to contact the buried collector layers.

* * * * *